(12) United States Patent
Douskey et al.

(10) Patent No.: US 9,103,879 B2
(45) Date of Patent: *Aug. 11, 2015

(54) TEST COVERAGE OF INTEGRATED CIRCUITS WITH TEST VECTOR INPUT SPREADING

(71) Applicant: International Business Machines Corporation, Armonk, NY (US)

(72) Inventors: Steven M. Douskey, Rochester, MN (US); Ryan A. Fitch, Southfield, MI (US); Michael J. Hamilton, Rochester, MN (US); Amanda R. Kaufer, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 57 days.

This patent is subject to a terminal disclaimer.

(21) Appl. No.: 13/778,812

(22) Filed: Feb. 27, 2013

(65) Prior Publication Data

US 2014/0089751 A1    Mar. 27, 2014

Related U.S. Application Data

(63) Continuation of application No. 13/628,231, filed on Sep. 27, 2012.

(51) Int. Cl.
*G01R 31/3177* (2006.01)
*G01R 31/3185* (2006.01)

(52) U.S. Cl.
CPC .... *G01R 31/3177* (2013.01); *G01R 31/318544* (2013.01); *G01R 31/318563* (2013.01)

(58) Field of Classification Search
CPC ............... G01R 31/318547; G01R 31/318536; G01R 31/318575; G01R 31/318555; G01R 31/31721; G01R 31/31937; G01R 31/3177; G01R 31/318544; G01R 31/318563
USPC ............................ 714/729, 30, 726; 702/117
See application file for complete search history.

(56) References Cited

U.S. PATENT DOCUMENTS

| | | | |
|---|---|---|---|
| 4,357,703 | A | 11/1982 | Van Brunt |
| 4,658,400 | A | 4/1987 | Brown et al. |
| 4,913,557 | A | 4/1990 | Segawa et al. |
| 6,195,775 | B1 | 2/2001 | Douskey et al. |
| 6,990,619 | B1 | 1/2006 | Kapur et al. |
| 7,237,162 | B1 | 6/2007 | Wohl et al. |
| 7,454,676 | B2 | 11/2008 | Hartmann et al. |
| 7,624,322 | B2 | 11/2009 | Duggal et al. |
| 7,743,299 | B2 | 6/2010 | Kapur et al. |
| 7,900,105 | B2 | 3/2011 | Kapur et al. |
| 7,917,821 | B2 | 3/2011 | Lee |
| 7,917,823 | B2 | 3/2011 | Dehnert et al. |
| 7,979,764 | B2 | 7/2011 | Foutz et al. |
| 2003/0200492 | A1 | 10/2003 | Nakao et al. |
| 2008/0148120 | A1 | 6/2008 | Seuring |

(Continued)

*Primary Examiner* — Albert Decady
*Assistant Examiner* — Kyle Vallecillo
(74) *Attorney, Agent, or Firm* — Jonathan V. Sry; Robert R. Williams

(57) ABSTRACT

An apparatus and method is provided for switching input pins to scan channels to increase test coverage. In one embodiment, a scan system connects a small number of input pins to several scan channels so that the input pins may be selectively switched. The input pins may transmit independent test vectors to test a large number of test areas on a semiconductor chip. The scan system may include a switching device such as a multiplexer (MUX).

5 Claims, 11 Drawing Sheets

(56) References Cited

U.S. PATENT DOCUMENTS

| | | |
|---|---|---|
| 2009/0240996 A1 | 9/2009 | Sasaya et al. |
| 2011/0078525 A1 | 3/2011 | Xia et al. |
| 2011/0099442 A1 | 4/2011 | Hales et al. |
| 2011/0166818 A1 | 7/2011 | Lin et al. |
| 2012/0011410 A1 | 1/2012 | Whetsel |
| 2012/0126781 A1 | 5/2012 | Narayanan et al. |

|     | SCAN CHANNEL | | | | | |
|---|---|---|---|---|---|---|
| TEST MODE | 0 | 1 | 2 | 3 | 4 | 5 |
| 0 | 1 | 2 | 3 | 1 | 2 | 3 |
| 1 | 1 | 1 | 1 | 2 | 2 | 2 |
| 2 | 1 | 1 | 1 | 1 | 1 | 1 |
| 3 | 1 | 1 | 1 | 1 | 1 | 1 |

| 426 ↘ | | SCAN CHANNEL | | | | | | | | | | | | | | | |
|---|---|---|---|---|---|---|---|---|---|---|---|---|---|---|---|---|---|
| TEST MODE | | 0 | 1 | 2 | 3 | 4 | 5 | 6 | 7 | 8 | 9 | 10 | 11 | 12 | 13 | 14 | 15 |
| | 0 | − | − | − | − | − | − | − | − | − | − | − | − | − | − | − | − |
| | 1 | − | − | − | − | − | − | − | − | + | + | + | + | + | + | + | + |
| | 2 | − | − | − | − | + | + | + | + | − | − | − | − | + | + | + | + |
| | 3 | − | − | + | + | − | − | + | + | − | − | + | + | − | − | + | + |
| | 4 | − | + | − | + | − | + | − | + | − | + | − | + | − | + | − | + |
| TEST MODE | | 16 | 17 | 18 | 19 | 20 | 21 | 22 | 23 | 24 | 25 | 26 | 27 | | | | |
| | 0 | + | + | + | + | + | + | + | + | + | + | + | + | | | | |
| | 1 | − | − | − | − | − | − | − | − | + | + | + | + | | | | |
| | 2 | − | − | − | − | + | + | + | + | − | − | − | − | | | | |
| | 3 | − | − | + | + | − | − | + | + | − | − | + | + | | | | |
| | 4 | − | + | − | + | − | + | − | + | − | + | − | + | | | | |

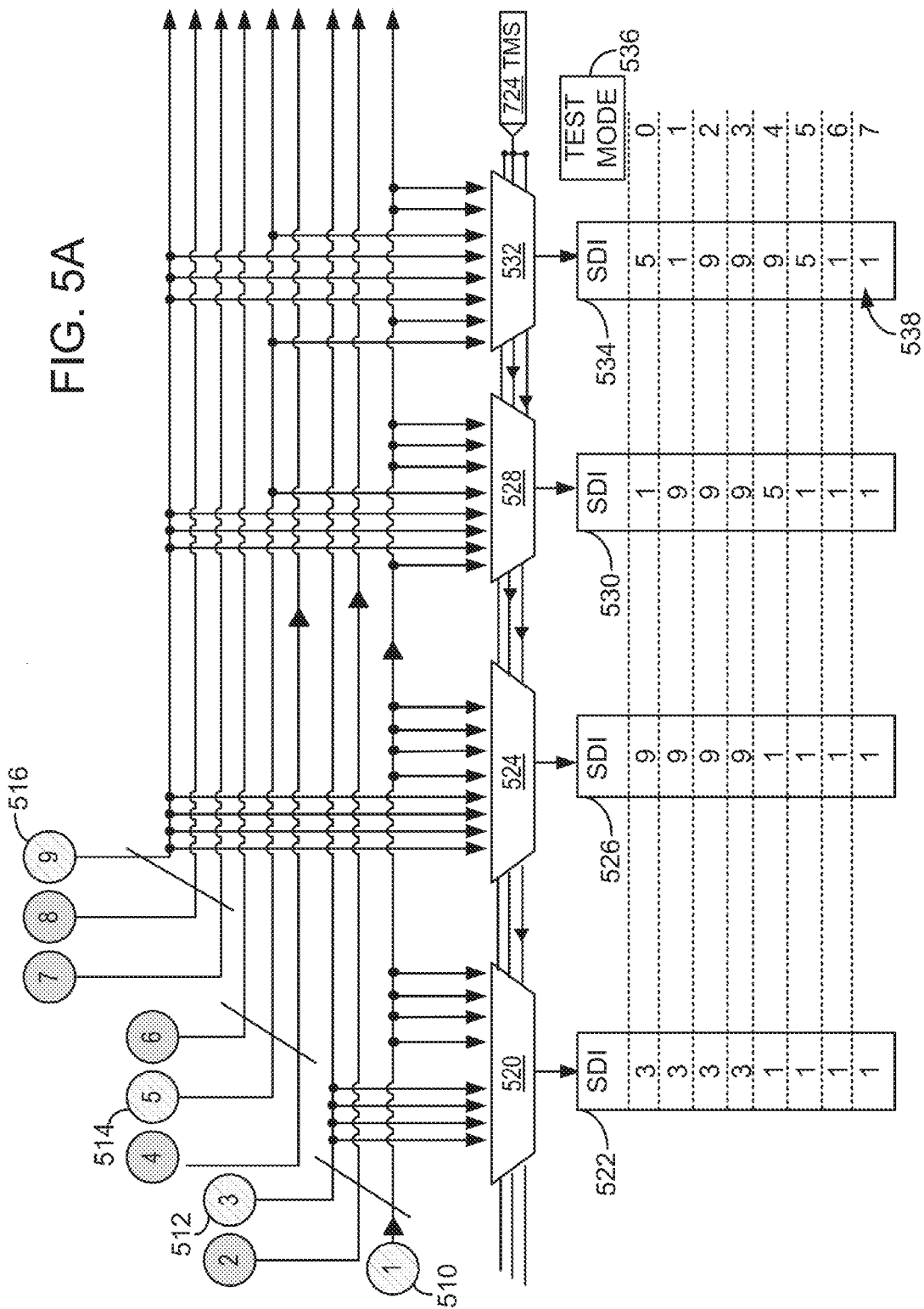

1-2-3 TRIPLET — 550 SCAN CHANNEL — 552

| TEST MODE | 0 | 1 | 2 | 3 | 4 | 5 |
|---|---|---|---|---|---|---|
| 0 | 1 | 2 | 3 | 3 | 3 | 3 |
| 1 | 1 | 1 | 2 | 3 | 3 | 3 |
| 2 | 1 | 1 | 1 | 2 | 3 | 3 |
| 3 | 1 | 1 | 1 | 1 | 2 | 3 |
| 4 | 2 | 3 | 1 | 1 | 1 | 1 |
| 5 | 2 | 2 | 3 | 1 | 1 | 1 |
| 6 | 2 | 2 | 2 | 3 | 1 | 1 |
| 7 | 2 | 2 | 2 | 2 | 3 | 1 |

9-1-5 TRIPLET SCAN CHANNEL

| TEST MODE | 6 | 7 | 8 | 9 | 10 | 11 |
|---|---|---|---|---|---|---|
| 0 | 9 | 1 | 5 | 5 | 5 | 5 |
| 1 | 9 | 9 | 1 | 5 | 5 | 5 |
| 2 | 9 | 9 | 9 | 1 | 5 | 5 |
| 3 | 9 | 9 | 9 | 9 | 1 | 5 |
| 4 | 1 | 5 | 9 | 9 | 9 | 9 |
| 5 | 1 | 1 | 5 | 9 | 9 | 9 |
| 6 | 1 | 1 | 1 | 5 | 9 | 9 |
| 7 | 1 | 1 | 1 | 1 | 5 | 9 |

3-6-9 TRIPLET — 554 SCAN CHANNEL

| TEST MODE | 12 | 13 | 14 | 15 | 16 | 17 |
|---|---|---|---|---|---|---|
| 0 | 3 | 6 | 9 | 9 | 9 | 9 |
| 1 | 3 | 3 | 6 | 9 | 9 | 9 |
| 2 | 3 | 3 | 3 | 6 | 9 | 9 |
| 3 | 3 | 3 | 3 | 3 | 6 | 9 |
| 4 | 6 | 9 | 3 | 3 | 3 | 3 |
| 5 | 6 | 6 | 9 | 3 | 3 | 3 |
| 6 | 6 | 6 | 6 | 9 | 3 | 3 |
| 7 | 6 | 6 | 6 | 6 | 9 | 3 |

8-6-1 TRIPLET — 556 SCAN CHANNEL

| TEST MODE | 12 | 13 | 14 | 15 | 16 | 17 |
|---|---|---|---|---|---|---|
| 0 | 8 | 6 | 1 | 1 | 1 | 1 |
| 1 | 8 | 8 | 6 | 1 | 1 | 1 |
| 2 | 8 | 8 | 8 | 6 | 1 | 1 |
| 3 | 8 | 8 | 8 | 8 | 6 | 1 |
| 4 | 6 | 1 | 8 | 8 | 8 | 8 |
| 5 | 6 | 6 | 1 | 8 | 8 | 8 |
| 6 | 6 | 6 | 6 | 1 | 8 | 8 |
| 7 | 6 | 6 | 6 | 6 | 1 | 8 |

FIG. 5B

TEST COVERAGE OF INTEGRATED CIRCUITS WITH TEST VECTOR INPUT SPREADING

CROSS-REFERENCE TO RELATED APPLICATIONS

This application is a continuation of co-pending U.S. patent application Ser. No. 13/628,231, filed Sep. 27, 2012. The aforementioned related patent application is herein incorporated by reference in its entirety.

TECHNICAL FIELD

Embodiments described herein generally relate to electronic components, and more specifically, to testing electronic components.

BACKGROUND

Digital Integrated Circuits (ICs) can be prone to defects introduced during a manufacturing process. To test for defects, a test vector may be introduced into scan channels and the output of the digital IC scan channels measured. Digital IC testing systems may be designed so that an external input pin transmits directly to a scan channel, which tests the digital logic.

SUMMARY

In one embodiment, a scan system connects a small number of input pins to several scan channels so that the input pins may be selectively switched. The input pins may transmit independent test vectors to test a large number of test areas on a semiconductor chip. The scan system may include a switching device such as a multiplexer (MUX). The scan system may also employ a high-level testing scheme to make as many unique combinations of input pins and scan channels as possible.

In another embodiment, test vectors transmitted through input pins may be selectively inverted before connecting to one or more scan channels. Test vectors may be transmitted through an input pin, which may access multiple scan channels.

In another embodiment, a method of grouping three or more input pins of a scan system is provided to increase the number of combinations of input pins and scan channels is disclosed. The method may involve dividing more than three input pins into multiple groups of three and switching the groups of three to a plurality of channels.

In another embodiment, a scan system may incorporate a pattern generator such as a random pattern generator or a pseudo random pattern generator. The output from the pattern generator may be selectively switched along with input pins. The output of the switching may be transmitted to multiple scan channels.

BRIEF DESCRIPTION OF THE DRAWINGS

Embodiments are illustrated by way of example, and not by way of limitation, in the figures of the accompanying drawings in which like reference numerals refer to similar elements or steps:

FIG. 2B shows a table that illustrates how the multiplexers (MUXs) may connect SDIs to the scan channels of FIG. 2A according to an embodiment.

FIG. 3 shows a table that illustrates an expanded testing scheme that the scan system may follow according to an embodiment.

FIG. 4B shows a table that illustrates an expanded testing scheme of FIG. 4A according to an embodiment.

FIG. 5A describes a scan system where SDIs may be selectively grouped to increase combinations of scan channels and SDIs according to an embodiment.

FIG. 5B describes a table of an expanded testing scheme of the scan system in FIG. 5A according to an embodiment.

DETAILED DESCRIPTION

A number of defects may be created during the manufacturing of a digital integrated circuit (IC). These defects may affect the logic output of the digital IC, which in turn adversely influences semiconductor chip quality and costs. Industry has developed a number of testing techniques to test for the defects. These techniques may rely on built in wires to transmit testing vectors into the digital ICs via scan channels. A test vector produces an output, which is then compared against an expected result for the section of the digital IC being tested. The wires that transmit test vectors are connected to input pins that receive test vectors from an external source such as a tester or internal source such as Logic Built In Self Test (LBIST). External testing is performed through chip testers, which are expensive and must operate at a high volume.

A goal of testing is to improve test coverage, i.e. to test as many likely scenarios as possible. Test coverage may be improved by expanding the controllability of test areas on the digital IC. Any increase in test coverage may correspond to an increase in the number of pins, or Scan Data In ports (herein referred to as "SDIs") that connect and transmit patterns to each scan channel. A chip may have a limited number of pins available for testing purposes, but may require many more pins to increase test coverage. An aspect of this disclosure is increased test coverage through distributed test vector selection for multiple scan channels so that the SDIs used for multiple scan channels can be made less interdependent.

Figure 1:
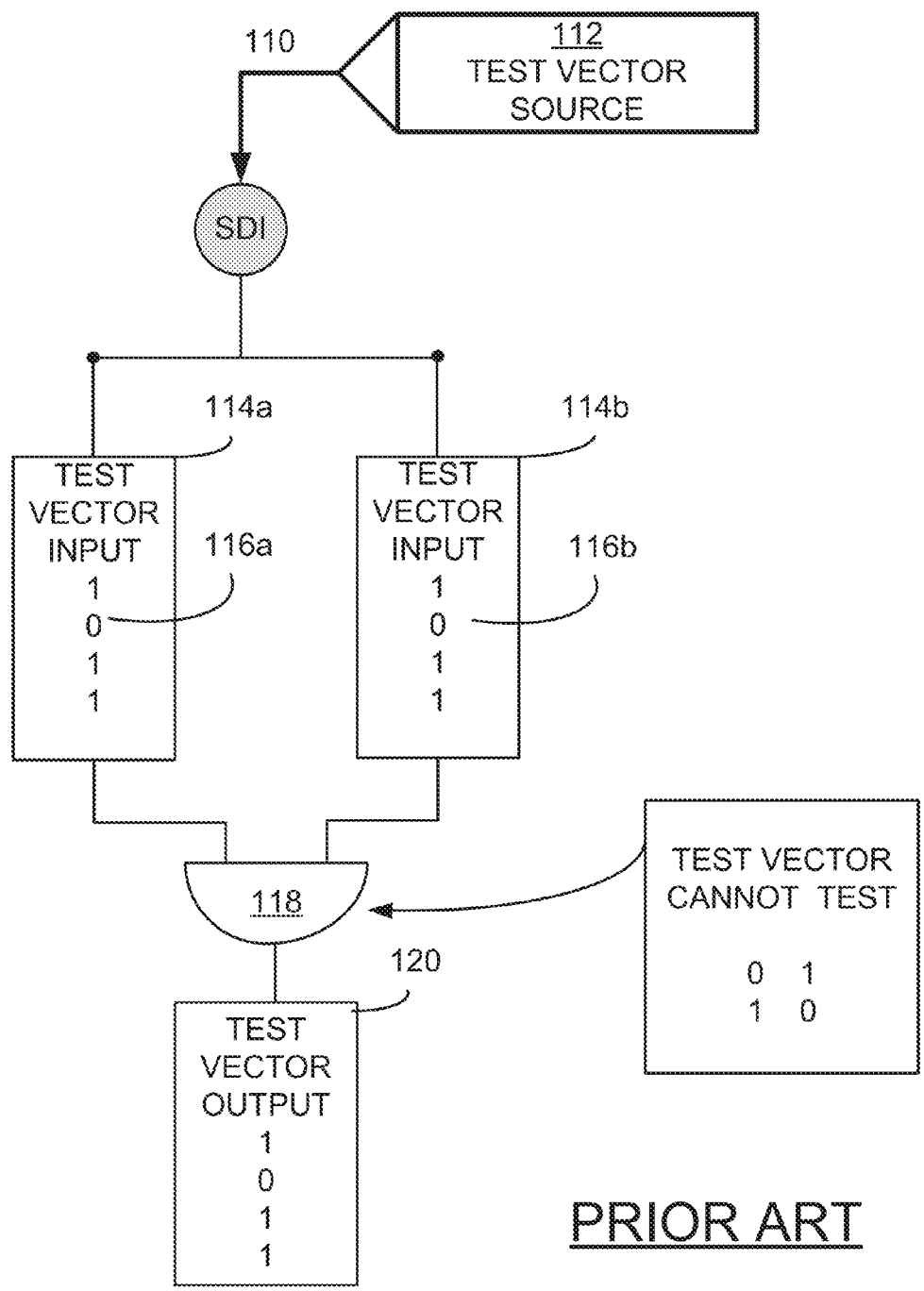
FIG. 1 shows prior art where a test vector is duplicated across two scan channels and used to test an AND gate.

Transmitting duplicate patterns, or test vectors may produce a lack of coverage of certain defects. In FIG. 1, an example of a prior art arrangement where a single test vector 110 from a test vector source 112 is duplicated across multiple scan channels, scan channels 114a and 114b, are shown. The test vectors input to the scan channels are duplicated in 116a and 116b. The test vectors in the shown example lead into an AND gate 118. The AND gate 118 may output 120 according to the test vectors 116a and 116b. The AND gate 118 needs to have certain combinations in order to conduct a full test. To conduct a full test the AND gate 118 may need a 0 input on scan channel 114a and a 1 input on 114b in order to test for an output of 0. In the example on FIG. 1, it may not be possible when the two test vector inputs 116a and 116b are duplicated.

Features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments may be practiced and to further enable those of skill in the art to practice the invention. It is also to be understood that the descriptions of the embodiments are provided by way of example only, and are not intended to limit the scope of this invention as claimed.

Figure 7A:
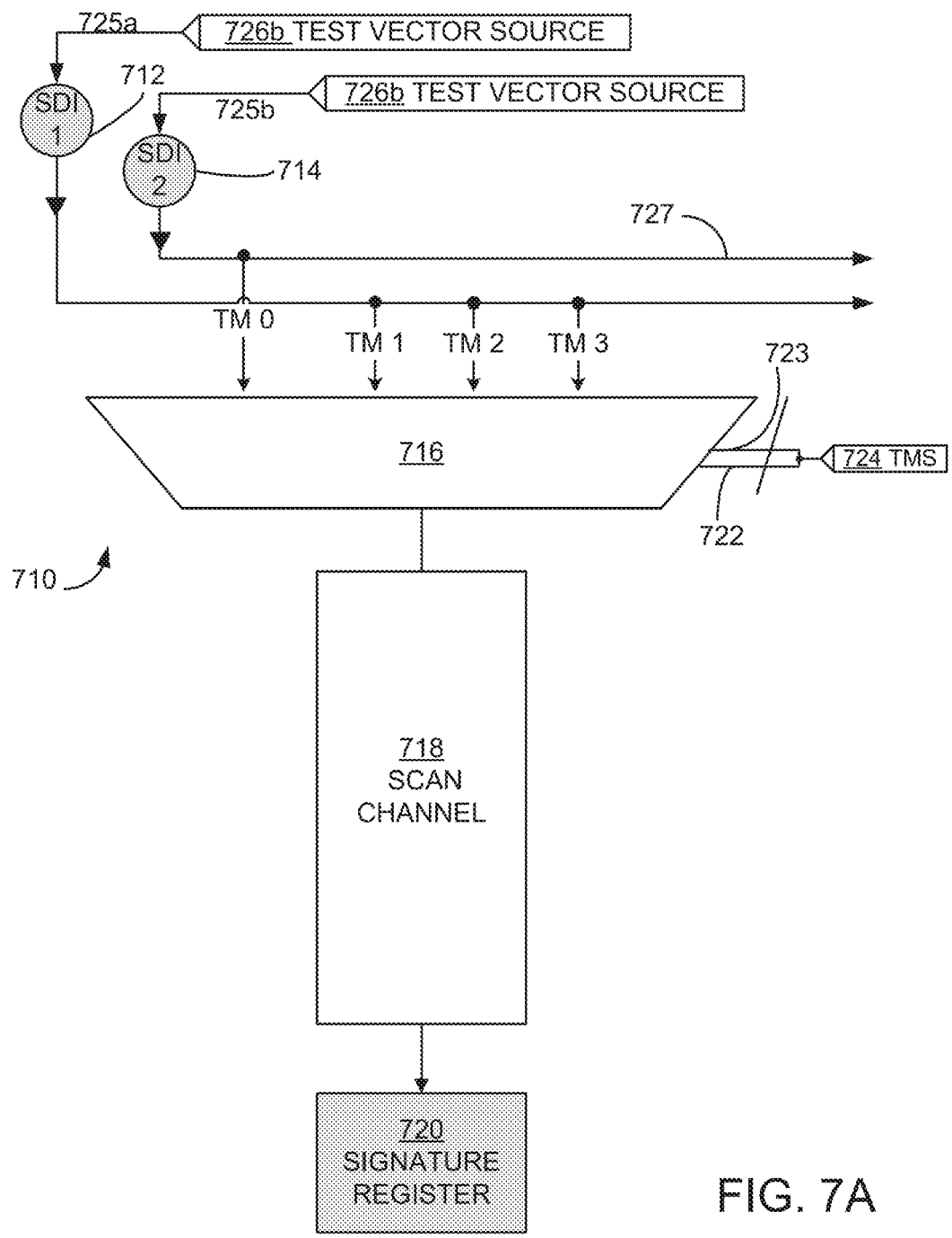
FIG. 7A shows a schematic representation of an embodiment of a scan system connected to two Scan Data Ins (SDIs) according to an embodiment.

FIG. 7A is one embodiment of a scan system 710 where two SDIs, a first SDI 712 and a second SDI 714 may be connected to a switching device such as a multiplexer (MUX) 716. The SDIs, 712, 714, may also be coupled to a switching device and the term connected is used interchangeably with the term coupled throughout the disclosure. The MUX 716 may be connected to the input of a scan channel 718. The scan channel 718 may be referred to as a scan chain and may connect to latches or testing logic within the scan system. The scan channel 718 and the scan channel MUX 716 may be one of a plurality of scan channel 718 and scan channel MUXs 716. In the shown embodiment, scan channels 718 may be linked to the SDI, 712, 714, through the MUX 716 with copper wire but iron, nickel, aluminum, silicon, or other alloy or conductive derivatives are imagined. The output of the scan channel one 718 may further connect to a signature register 720. The signature register 720 may collect the result of applying a test vector to a scan channel. The signature register 720 may collect, compile, and store an actual result of applying the test vector to multiple scan channels. The signature register 720 may provide test data to an external tester that further compares an expected result of applying the test vector to the scan channel 718 with the actual result of applying the test vector to the scan channel 718. The signature register 720 may be a Multiple Input Signature Register, or any other device that receives test data from the scan channel 718.

The MUX 716 may have gating or selecting logic and may select a single input from multiple possible inputs. For example, the MUX 716 may have a series of AND, OR, and inverters as known in the art. In the shown embodiment, the MUX 716 is a four to one MUX with the selector of the MUX 716 receiving a test mode signal along a test mode signal path 722 from a test mode signal source 724.

The test mode signal may transmit a test mode. The test mode may be a signal that causes the switching device such as the MUX 716 to select a single SDI such as the first SDI 712 or the second SDI 714 out of multiple SDIs to the scan channel 718. The test mode signal may be encoded in binary or decimal format but other configurations are contemplated. In the shown embodiment, the test mode may be static and may be created through encoding but other configurations are contemplated such as dynamic test mode switching where the test mode is switched on the fly or generated from a pattern generator.

The test mode signal source 724 may be sourced from chip pins or internal latches and include an encoder and a decoder depending on the number of inputs on the MUX 716. In the shown embodiment, the test mode signal source 724 is an external input that may broadcast a single test mode but other configurations are contemplated such as from a programmed controller or a Logic Built-in Self Test (LBIST). The test mode signal path 722 may also pass through one or more additional MUXs so that the test mode signal is broadcast to a series of scan systems 710 but other configurations are contemplated such as routing through a test mode controller.

If the test mode is dynamically switched, the MUX 716 may handle each request in sequence. For example, the MUX 716 may receive a test mode signal and connect the test vector from the first SDI then receive another test mode signal to switch to the second SDI. In the example, the MUX 716 could wait to finish receiving the entire test vector from the first SDI before receiving the test vector from the second SDI. The MUX 716 could also receive test mode signals from a controller in order e.g. test mode 1, test mode 2, or test mode 3, etc. or a controller could prioritize each test mode signal path 722 to optimize speed or coverage such as selecting test mode 3 before test mode 0 to ensure that a test vector from a particular SDI gets scanned first.

The test mode signal in the shown embodiment is transmitted to the MUX 716 selector through two selector pins 723. For purposes of illustration, the number of selector pins used to deliver the test mode signal depends on the number of inputs used on the MUX 716 according to the following formula: Number of pins=$\log_2$(Number of inputs on the MUX). In the shown embodiment, a four-to-one MUX is used, therefore there are two selector pins required for the selector.

When the MUX 716 receives a test mode signal 722 from the test mode signal source 724, the MUX 716 may connect a test vector 726a from the first SDI 712 or a test vector 726b from the second SDI 714 to a scan channel 718 based on the test mode given by the test mode source 724 in a manner that increases test coverage. The test vector 726, in the shown embodiment, is from an external source but it may also be from an internal source such as from a pseudo random pattern generator (PRPG) or an LBIST.

A test vector 725a may originate from a test vector source 726a and pass through the first SDI 712. The test vector 725a is then broadcast along a net 727. A test vector 725b may also originate from a test vector source 726b and be transmitted into the second SDI 714. The test vector source 726a may be external or internal and be programmed or randomly generated according to various embodiments of the invention.

The test mode signal source 724 may broadcast a continuous test mode signal to the MUX 716. The MUX 716 may be wired in a way that selects the SDI transmitting the test vector based on the test mode signal to the MUX selector 716. In the embodiment shown in FIG. 7A, the MUX 716 may select the first SDI 712 or second SDI 714 to connect to scan channel one 710 according to the table 728 shown on FIG. 7B which may be part of a larger testing scheme to increase test coverage by increasing combinations of SDIs and scan channels discussed below.

Figure 7B:
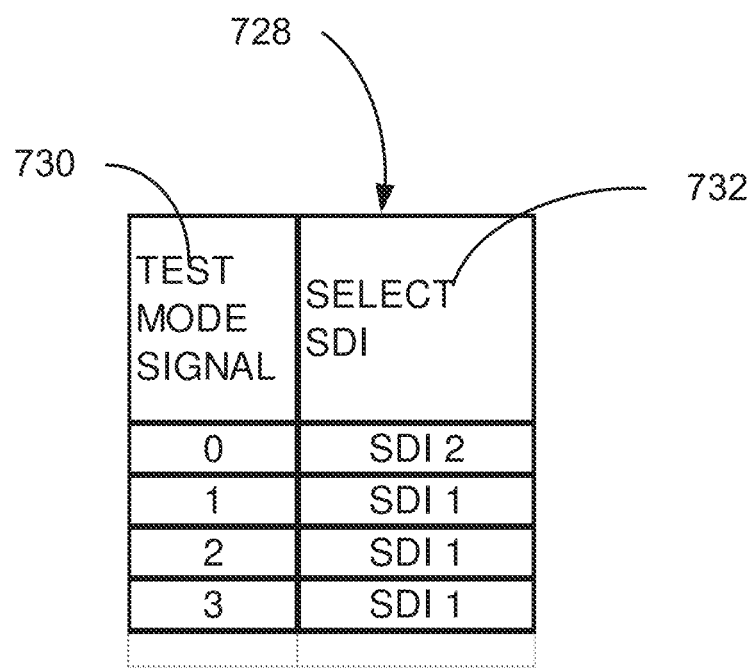
FIG. 7B shows a table that illustrates how a multiplexer may connect SDIs to scan channels in the scan system of FIG. 7A according to an embodiment.

For example, table 728 on FIG. 7B illustrates how the scan channel 718 may work with the first and second SDIs 712, 714. A test mode signal column 730 of 0 may result in the test vector 725b traveling along the second SDI net 727 connecting with selected scan channels. A test mode signal of 1 to the MUX 716 selector, may result in a selection column 732 from the first SDI 712 to scan channel one 718. A test vector 725a may then be transmitted into scan channel one 718.

In the shown embodiment, the table 728 may be incorporated into the hardware design of the MUX 716 and digital logic may select an appropriate SDI for connecting to the MUX 716. The MUX 716 may produce the result in the table 728 by a series of logic gates. The selection of scan channel to SDI may also occur with software selection by a controller but other configurations are contemplated.

Figure 2A:
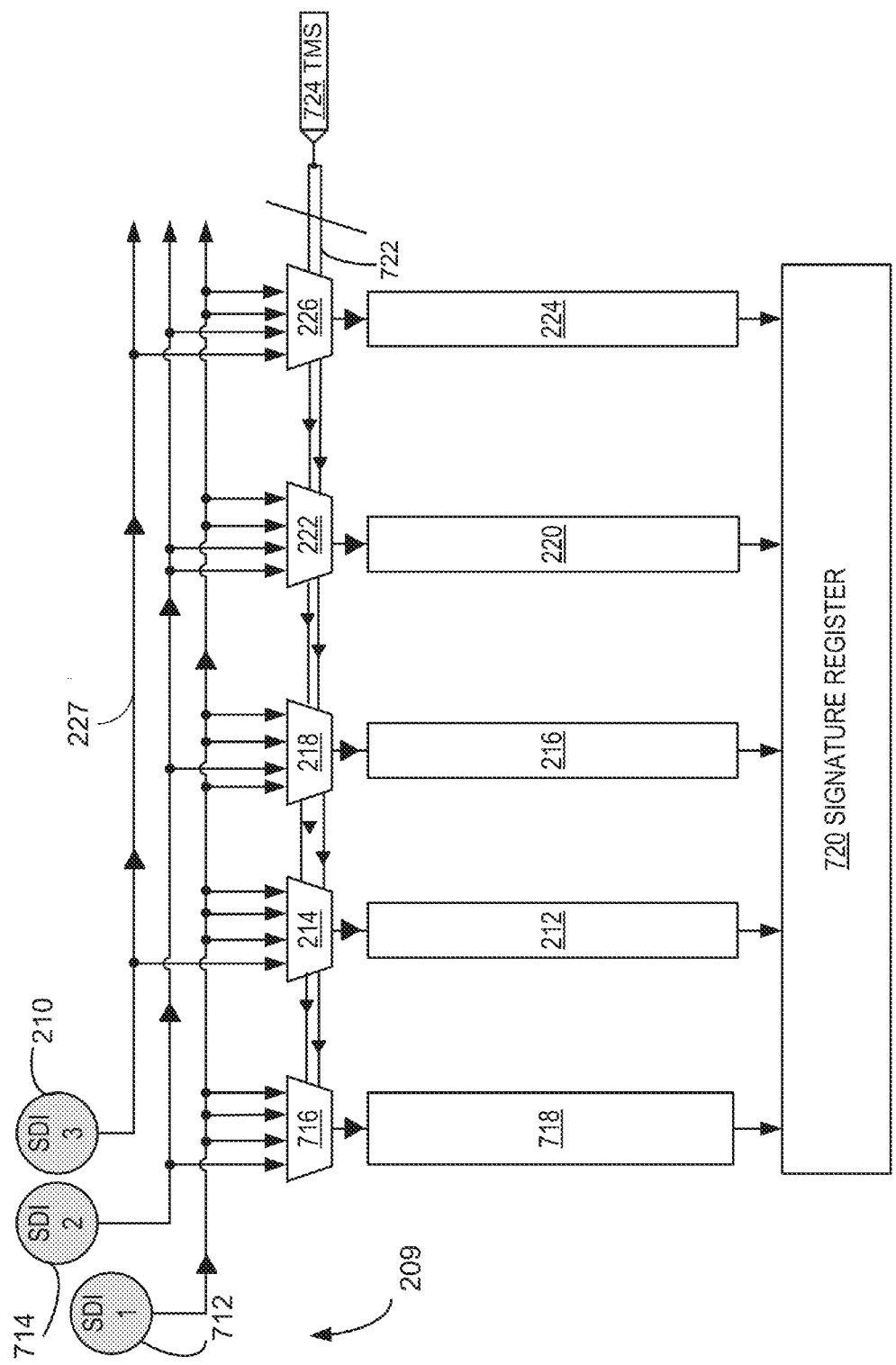
FIG. 2A illustrates an expanded scan system involving three SDIs and five scan channels according to an embodiment.

FIG. 2A is another embodiment of a scan system 209 shown with a third SDI 210 and five scan channels; scan channel one 718 from FIG. 7A connected to the output of the scan channel one MUX 716, scan channel two 212 connected to the output of a scan channel two MUX 214, scan channel three 216 connected to the output of a scan channel three MUX 218, scan channel four 220 connected to the output of a scan channel four MUX 222, and scan channel five 224 connected to the output of a scan channel five MUX 226. The five scan channels may be connected to the SDI's in a similar manner as scan channel one 718 in FIG. 7A using a four-to-one MUX. FIG. 2A shows an embodiment with five scan channels, but eighty-one scan channels are possible with three SDIs according to the table 310 discussed on FIG. 3.

In the shown embodiment in FIG. 2A, a test mode signal 722 may output a select signal transmitted as in FIG. 7A. The test mode signal may be broadcast to all scan channel MUXs simultaneously or dynamically using test mode signal switching.

The embodiment shown on FIG. 2A may operate in a similar manner as the scan system in FIG. 7A. Table 228 on FIG. 2B illustrates how the five scan channels may work with the three SDIs. For example, in scan channel two 212, the scan channel two MUX 214 may receive a test mode signal of 0, according to the table 228 on FIG. 2B, from the test mode signal source 724, which may connect the third SDI 210 to scan channel two 212 according to the scan channel two column 230. A test vector is transmitted to the third SDI 210 in a manner similar to FIG. 7A and the scan channel two MUX 214 connects the third SDI 210 to scan channel two 212. The test vector may continue to be broadcast along the net 227. The scan channel five MUX 226 may also receive a test mode signal of 0, according to the column 234 on FIG. 2B, and transmit the test vector from the third SDI 210 to scan channel five 224.

The table 228, shown in FIG. 2B, uses five scan channels. There may be design considerations for some configurations to use select scan channels such as reducing wiring or logic needs. In the shown embodiment, only scan channel one 718, scan channel two 212, scan channel three 216, and scan channel four 220 may be used because a scan channel zero column 232 may allow the first SDI to be reused in another grouping of SDIs and a scan channel five column 234 may connect to three SDIs which increases wiring and logic needs.

Figure 3:
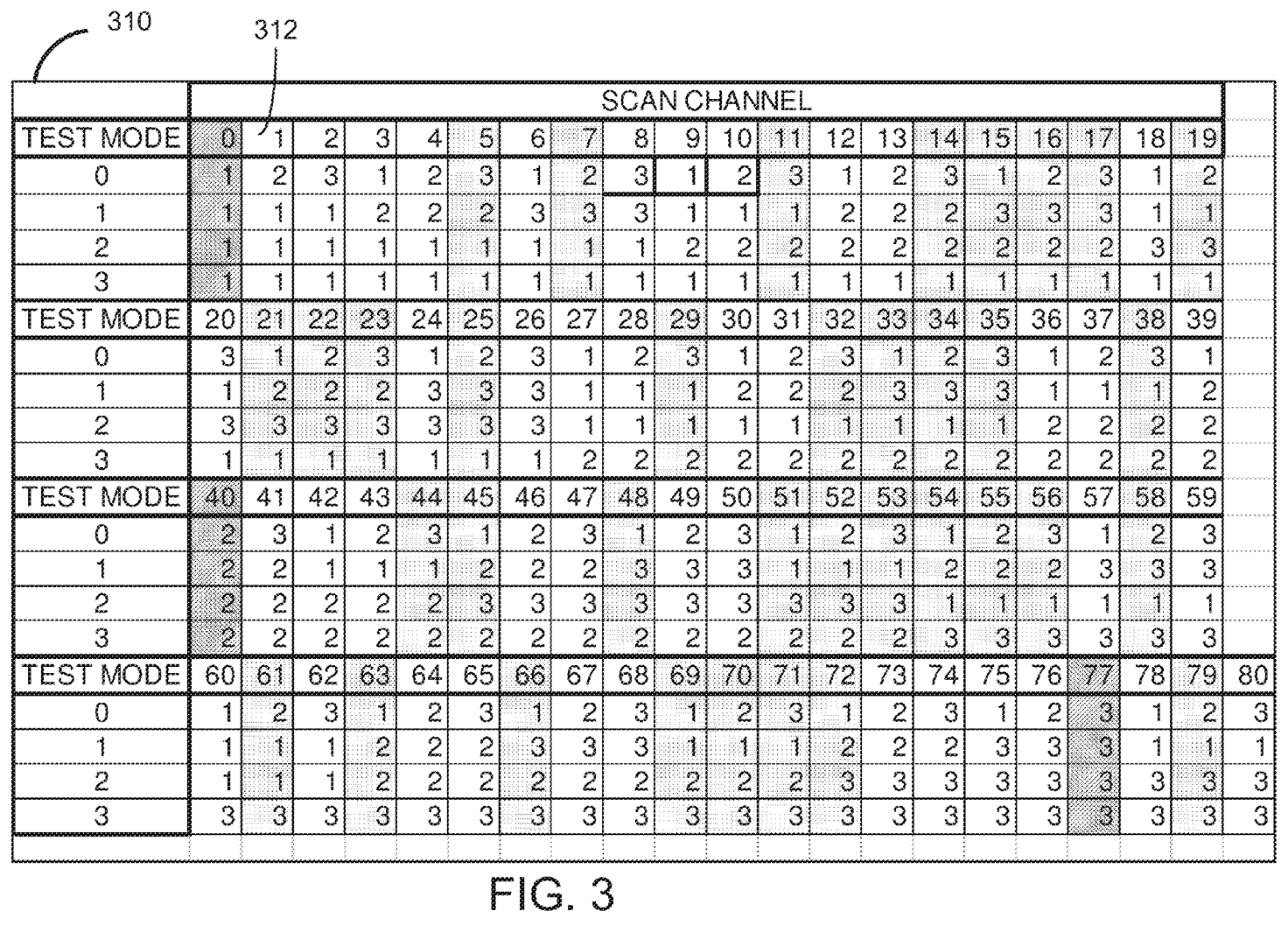

FIG. 3 shows an exemplary embodiment of a table 310 expanded to eighty-one scan channels that further increases all possible combinations of test modes so that each SDI may connect to a plurality of scan channels. Increasing the number of scan channels beyond eighty-one scan channels may be further expanded by using a different set of three SDIs in a similar manner to FIG. 5B discussed below. For example, if more scan channels than eighty-one are required, then a new grouping of SDIs may be formed that reuse one or fewer SDIs from a previously used group of three SDIs. The scan channel one column 312 corresponds to the table 728 in FIG. 7B. Scan channel two, scan channel three, scan channel four, and scan channel five are shown in the table 228.

Table 310 of FIG. 3 may be developed to increase test coverage and may use trinary patterns. A trinary pattern may be developed based on three SDI's used. For example, in test mode 0, or $3^0$, an SDI appears once without repeating. In test mode 1, or $3^1$, an SDI repeats 3 times in a row. In test mode 2, or $3^2$, an SDI repeats nine times in a row. In test mode 3, or $3^3$, an SDI repeats twenty-seven times in a row. The table 310 may be tabulated so that no two scan channels will be the same through all test modes. It may be also possible to use a binary, quaternary, or quinary pattern to extrapolate a table. The MUX wiring may become more complex if higher base numbers patterns such as quaternary, or quinary are used.

In the shown embodiment, certain scan channels may be used in table 310 due to similar reasons as in table 228 in FIG. 2A. Therefore, the shown embodiment with three SDIs may operate using sixty-six scan channels. The use of certain channels on table 310 may be compiled into a channel use list. The channel use list may be uploaded into a controller for the test mode signal or incorporated into the circuit design of the MUX. This channel use list may also be generated automatically but other embodiments are contemplated.

Figure 4A:
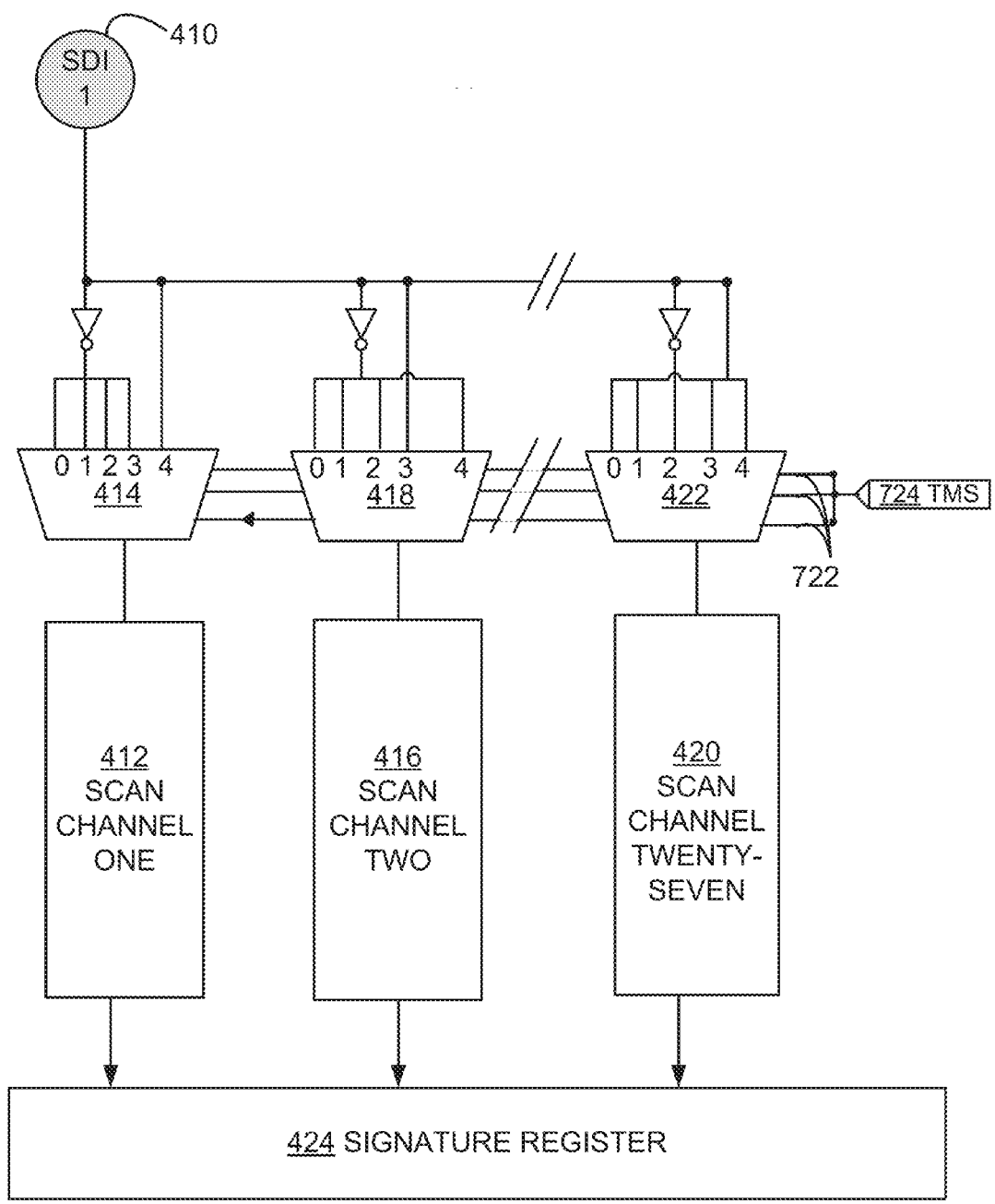
FIG. 4A describes a scan system where certain channels may be selectively inverted according to an embodiment.

FIG. 4A represents an embodiment that selectively inverts certain scan channels. In the embodiment shown, there is one SDI, the first SDI 410, connected to the input of twenty-seven scan channels MUXs with scan channel one 412 connected to the output of the scan channel one MUX 414, scan channel two 416 connected to the output of the scan channel two MUX 418, and scan channel twenty-seven 420 connected to the output of the scan channel twenty-seven MUX 422. The scan channels may connect to a signature register 424 in a manner similar to the embodiment in FIG. 7A. Only twenty-seven scan channels are pictured in this embodiment, but using a different number of scan channels or test modes is contemplated.

The MUX 414 may take inputs from the first SDI 410 and output them to a scan channel 412. The MUX 414 may also contain a selector. In the shown embodiment, the MUX 414 is a five to one MUX but other configurations are contemplated. The MUX 414 selector may correspond to an input for a test mode signal 722. The test mode signal 722 may be configured in a similar manner according to the embodiment shown in FIG. 7A. In the shown embodiment, the test mode signal requires three pins to handle 5 inputs but other configurations are contemplated.

A test vector may enter the first SDI 410 and follow the pathway to a scan channel. The test vector may be selectively inverted prior to entering a scan channel MUX, according to the table 426 of FIG. 4B. The inverted test vectors may be transmitted in parallel with the non-inverted test vectors. The scan channel MUX may use the broadcast test mode signal and select which test vector to connect. The test vector may be transmitted to the scan channel logic which may be further processed by a signature register 724.

Using scan channel twenty-seven 420 for illustrative purposes, a test vector may be transmitted through the first SDI 410 in a manner consistent with the embodiment in FIG. 7A. The test vector may then be broadcast along a pathway until the test vector approaches the scan channel twenty-seven MUX 420. Before the scan channel twenty-seven MUX 420, the test vector is inverted according to the table 426 on FIG. 4B, which may increase test coverage. In the shown example, the test vector is split into five inputs with the test vector only being inverted for test mode 2.

The scan channel twenty-seven MUX 422 at the selector, may receive a test mode signal 722 input from a test mode signal source 724 in a manner consistent with the embodiment in FIG. 7A. The test mode signal may transmit to the selector on the scan channel twenty-seven MUX 422. For test mode zero on the scan channel twenty-seven MUX 422, the original, non-inverted test vector may transmit to scan channel twenty-seven. Likewise, a test mode signal of 2 causes the inverted test vector to be transmitted to scan channel twenty-seven.

The table 426 on FIG. 4B is populated using binary patterns, inverted and non-inverted, to increase the number of combinations of test vectors being transmitted to the scan channels. For twenty-seven scan channels, there are at least five test modes available to produce the number of combinations that prevent any two scan channels from being identical through all test modes. For example, test mode 0 is inverted for $2^4$ or sixteen channels, test mode 1 is inverted for every $2^3$ or eight channels, test mode 2 is inverted for every $2^2$ or four channels, test mode 3 is inverted for every $2^1$ or two channels and test mode 4 is inverted for $2^0$ or every other channel. This configuration may reduce the amount of overlap so that no two scan channels are the same through all test modes.

FIG. 5A represents an embodiment according to the disclosure that applies the multiplexing features of FIG. 7A to multiple SDIs. The embodiment of FIG. 5A may be a design or wiring scheme that distributes multiple SDIs to multiple scan channels with a reduced SDI assignment overlap between scan channels. The multiplexing may occur through grouping three SDIs out of multiple SDIs so that any three scan channels may connect to different SDIs through all test modes. In the shown embodiment, only the first SDI 510, the third SDI 512, the fifth SDI 514, and the ninth SDI 516 are connected to the scan channel MUXs, The output of scan channel five MUX 520 is further coupled to the input of scan channel five 522, the output of scan channel six MUX 524 is further connected to the input of scan channel six 526, the output of scan channel seven MUX 528 is further connected to the input of scan channel seven 530, and the output of scan channel eight MUX 532 is further connected to the input of scan channel eight 534. The SDI and scan channels are connected in a manner consistent with the embodiment in FIG. 2A. The MUX may be designed to select a broad number of SDI connections in response to test modes inputs. The MUX in the shown embodiment is an eight-to-one MUX with a three select inputs and a single output, but other configurations are contemplated.

The shown embodiment uses eight different test modes 536 and requires three wires to transmit the test mode signal from the test mode signal source 724 connected in a manner consistent with the embodiment shown in FIG. 2A. The test mode signals are supplied to the MUX selector. The shown embodiment may operate in a manner consistent with the embodiment shown in FIG. 2A. For example, the test mode signal of 0 will be broadcast to the scan channel eight MUX 532 according to the table shown on 538. A test vector may be transmitted into and along the fifth SDI 514 which is connected to an input of the MUX 532. The scan channel eight MUX 532 may select the test vector from the fifth SDI 514 to connect to scan channel eight 538 in accordance with the application of test mode 0 transmission from the test mode signal source 724 into the channel eight MUX 532. The selection may occur in accordance with table 538.

FIG. 5B is an example of a testing scheme involving nine SDIs linked to eighteen scan channels so that no three channels match in all test modes according to another embodiment. The tables may be formed using a repeating SDI pattern that increases the combination of SDI test vector inputs and scan channels. The configuration of SDI and scan channel couplings may be further accomplished by grouping any three SDIs, or triplets, and matching those three SDIs to a number of scan channels. A triplet may connect to six scan channels and eight test modes. Other configurations are contemplated and the number of test modes required may be related to the channels according to the following formula: Number of test modes=2*(Number of channels−2).

An encode may be the mechanism used to develop combinations of SDIs across different test modes in a single scan channel. In the shown embodiment, each triplet can produce eighty-one trinary counted channel encodes. Additional trinary encodes can be produced by reusing an SDI from a previously generated group of encodes. Four tables are shown in the example in FIG. 5B, the 1-2-3 triplet table 550, the 9-1-5 triplet table 552, the 3-6-9 triplet table 554, and the 8-6-1 triplet table 556. Scan channel five 522 on FIG. 5A corresponds to the 1-2-3 triplet table 550 on FIG. 5B. Scan channel six 526, scan channel seven 530, and scan channel eight 534 are also shown on the 9-1-5 triplet table 552. In the 9-1-5 triplet table 552, the only possible SDI connections to scan channel six through scan channel eleven are the ninth SDI, the first SDI, and the fifth SDI. The scan channels are labeled consecutively with the 3-6-9 triplet table 554 added to illustrate why any three channels cannot match in any test mode.

The triplets may be matched so that any three scan channels contain a test mode that allows the scan channels to differ. It may also be possible to eliminate a triplet that reuses an SDI once the SDI has been used in every location of a triplet. For example, the 3-6-9 triplet may be removed from the 1-2-3 triplet, the 9-1-5 triplet, and the 8-6-1 triplet because the 3-6-9 triplet may create patterns that are not unique. For example, the twelfth channel encode from the 3-6-9 triplet 554 would overlap with the fifth 550 and sixth channel 552 encodes.

Figure 6:
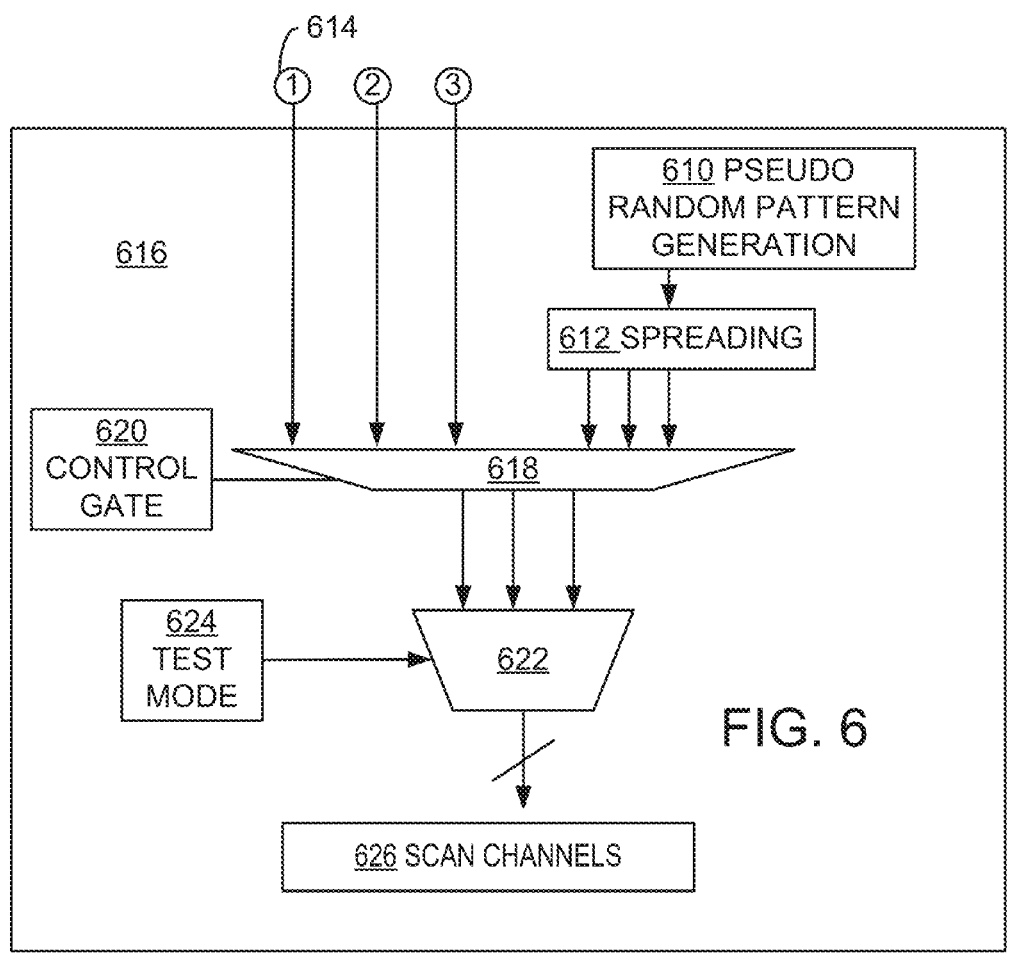
FIG. 6 shows a schematic representation of a scan system using a random pattern generator from the top view according to an embodiment.

FIG. 6 is an embodiment according to the disclosure of a chip 616 where test vectors originate from an internal source such as a Pseudo-Random Pattern Generation (PRPG) 610. The embodiment may involve PRPG 610 generating a test vector. The PRPG 610 may be phase shifted using an XOR spreading function 612. In the shown embodiment, an XOR spreading function 612 may separate different bits and may create a fixed function. A test vector may be input through an SDI 614. In the shown embodiment, there are three SDIs in a side channel configuration located outside of the chip 616 but other configurations are contemplated. The SDI 614 may be connected to a first MUX 618. The first MUX 618 may have a selector connected to a control gate 620. The control gate 620 may further direct the first MUX 618 to select between the test vector from the SDI 614 and the phase-shifted, PRPG input 612. The first MUX 618 may further connect to a second MUX 622. In the shown embodiment, the output from the first MUX 618 may have three channels but more channels are contemplated. The second MUX 622 selector may be connected to a test mode source 624, which may direct the scan channel to connect to the second MUX 622 output. The test mode source may be static or dynamic and may cycle through multiple test modes similar to the embodiment shown in FIG. 2A. The second MUX 622 may output to a plurality of different scan channels 626 by broadcast or may be selectively input through SDIs in a system similar to the embodiment in FIG. 2A. In the shown embodiment, the second MUX 622 broadcasts to seventy-nine scan channels 626.

While the disclosed subject matter has been described with reference to illustrative embodiments, this description is not intended to be construed in a limiting sense. Various modifications of the illustrative embodiments, as well as other embodiments of the subject matter, which are apparent to persons skilled in the art to which the disclosed subject matter pertains are deemed to lie within the scope and spirit of the disclosed subject matter.

What is claimed is:

1. A method for improving test coverage on a plurality of switching devices, a switching device is electrically coupled to a scan chain and to at least two test vector sources and the switching device is controlled by a test mode signal source that provides a plurality of test mode signals to the plurality of switching devices, comprising:

receiving the plurality of test mode signals;
electrically coupling a first schedule of test vector sources to a first scan chain and a second schedule of test vector sources to a second scan chain in response to the plurality of test mode signals,
 wherein the first schedule is different than the second schedule throughout the plurality of test mode signals,
 wherein the first schedule of test vector sources includes selection of a first test vector source in response to a first test mode signal, and selection of a second test vector source in response to a second test mode signal,
 wherein the second schedule of test vector sources includes selection of the second test vector source in response to the first test mode signal, and selection of the first test vector source to the second scan chain in response to a second test mode signal,
 wherein the first test mode signal from the plurality of test mode signals causes a first switching device to electrically couple the first test vector source from the first schedule of test vector sources to the first scan chain and, simultaneously, causes a second switching device to electrically couple the second vector source from the second schedule of test vector sources to the second scan chain,
 wherein the second test mode signal from the plurality of test mode signals causes the first switching device to electrically couple the second test vector source from the first schedule of test vector sources to the first scan chain and, simultaneously, causes the second switching device to electrically couple the first test vector source from the second schedule of test vector sources to the second scan chain,
 wherein the second test vector source is different than the first test vector source,
 wherein the first test mode signal for a first switching device from the plurality of switching devices is different within the same time domain from a second test mode signal for a second switching device from the plurality of switching devices; and receiving a test vector from a test vector source.

2. The method of claim 1, wherein electrically coupling the first schedule of test vector sources to the first scan chain and the second schedule of test vector sources to the second scan chain includes the first scan chain and the second scan chain each receiving a different combination of test vector sources when the switching device cycles through the plurality of test mode signals.

3. The method of claim 1, further comprising:
 electrically coupling a third schedule of test vector sources to a third scan chain, wherein the first scan chain, the second scan chain, and the third scan chain each receive a different combination of test vector sources when the switching device cycles through the plurality of test mode signals.

4. The method of claim 1, wherein a number of scan chains is greater than a number of test vector sources.

5. The method of claim 1, wherein at least one of the test vector sources is selectively inverted for every bit of the test vectors from the test vector source.

* * * * *